United States Patent [19]

Shur

[11] Patent Number: 4,905,059
[45] Date of Patent: Feb. 27, 1990

[54] MODULATION DOPED RADIATION EMITTING SEMICONDUCTOR DEVICE

[75] Inventor: Michael Shur, Golden Valley, Minn.

[73] Assignee: Regents of the University of Minnesota, St. Paul, Minn.

[21] Appl. No.: 245,974

[22] Filed: Sep. 19, 1988

Related U.S. Application Data

[63] Continuation of Ser. No. 911,520, Sep. 25, 1986, abandoned.

[51] Int. Cl.$^4$ .............................................. H01L 33/00
[52] U.S. Cl. ...................................... 357/17; 357/16; 357/22
[58] Field of Search .......................... 357/16, 17, 22 A

[56] References Cited

U.S. PATENT DOCUMENTS

| | | | |
|---|---|---|---|
| 3,840,888 | 10/1974 | Gaensslen et al. | 357/23.7 |
| 4,198,644 | 4/1980 | Esaki | 357/12 |
| 4,538,165 | 8/1985 | Chang et al. | 357/22 A |
| 4,546,480 | 10/1985 | Burnham et al. | 357/16 |
| 4,603,469 | 8/1986 | Armiento et al. | 357/22 A |
| 4,616,244 | 10/1986 | Yamazaki | 357/17 |
| 4,688,061 | 8/1987 | Sasaki | 357/22 A |

OTHER PUBLICATIONS

Sze, Physics of Semiconductor Devices, 2nd Edition, 1981 (Wiley, NY), p. 848.

Primary Examiner—William D. Larkins
Attorney, Agent, or Firm—Kinney & Lange

[57] ABSTRACT

A radiation-emitting semiconductor device (i.e. an LED or laser) emits radiation produced by radiative recombination of electrons from a field induced two-dimensional (2-d) electron gas with holes from a field induced two-dimensional (2-d) hole gas. The device uses a narrower band semiconductor active layer sandwiched between two layers of a wider band semiconductor. Top and bottom gates are used to induce the electron and hole 2-d gasses in the active layer. N+ and P+ regions are used to contact the 2-d electron and hole gasses to provide separate biasing. The thickness of the active layer is such that a field induced PN junction or PIN structure is formed at which radiative recombination can occur.

13 Claims, 2 Drawing Sheets

MODULATION DOPED RADIATION EMITTING SEMICONDUCTOR DEVICE

This is a continuation of application Ser. No. 06/911,520, filed Sept. 25, 1986 (now abandoned).

BACKGROUND OF THE INVENTION

1. Field of the Invention.

The present invention relates to semiconductor radiation emitting devices. In particular, the present invention relates to a semiconductor device which produces radiation based on radiative recombination of electrons from a two-dimensional electron gas with holes from a two-dimensional hole gas induced in the semiconductor device.

2. Description of the Prior Art.

Light emitting diodes and semiconductor lasers are widely used to produce radiation, particularly in the infrared and some portions of the visible part of the electromagnetic spectrum. A light emitting diode makes use of a semiconductor PN junction which is forward biased to emit spontaneous radiation. This radiation is produced by the radiative recombination of holes and electrons within the semiconductor material. The particular wavelength at which the semiconductor device emits depends upon the energy band gap of the semiconductor material, and whether the material is a direct or indirect band gap material.

Semiconductor lasers are semiconductor PN junction devices which produce radiation which has spatial and temporal coherence. Selected surfaces of the semiconductor laser are polished, and appropriate dimensions are selected so that the semiconductor device becomes an optical resonator.

There have been continuing research efforts expended on the development of light emitting diodes and lasers using semiconductor materials having energy gaps compatible with the shorter wavelength portions of the visible spectrum, the UV spectrum and beyond. The development of light emitting diodes and semiconductor lasers in these portions of the spectrum, however, has trailed the development of devices in the infrared and longer wavelength visible spectrum because of numerous problems with the semiconductor materials themselves. One problem is the tendency of wider band gap materials to be non-amphoteric (i.e. the materials can only be impurity doped one conductivity type). For example, zinc selenide can be doped N-type but P-type doping is extremely difficult. Other materials have, to date, been capable of impurity doping in only one conductivity type. This, of course, has in the past precluded the use of those materials as a PN junction light emitting diode or semiconductor laser.

In addition, the use of impurity doping in order to produce PN junctions creates traps in the device which permit non-radiative recombination. This decreases the amount of radiation which can be emitted, and thus decreases the efficiency of the device and limits its output power.

SUMMARY OF THE INVENTION

The present invention is a radiation emitting device in which electron and hole two-dimensional gases are induced into the same semiconductor layer by means of modulation doping. In this device, a narrower band gap semiconductor is sandwiched between layers of a wider band gap semiconductor. A pair of gates are used to induce the electron and hole two-dimensional gases.

In addition, the device preferably includes first and second contact means for making electrical contact with the two-dimensional electron gas and the two-dimensional hole gas, respectively. The first contact means is preferably an N+ region which is in contact with the narrower band gap semiconductor layer, and the second contact means includes a P+ region which is in contact with the narrower band gap semiconductor layer.

With the device of the present invention, the thickness of the narrower band gap semiconductor layer is such that an induced PN junction or PIN structure is formed by applying gate voltages. The induced PN junction or PIN structure can be biased like a conventional junction device so that the electrons and holes recombine to produce radiation.

DETAILED DESCRIPTION OF THE PREFERRED EMBODIMENTS

Figure 1:
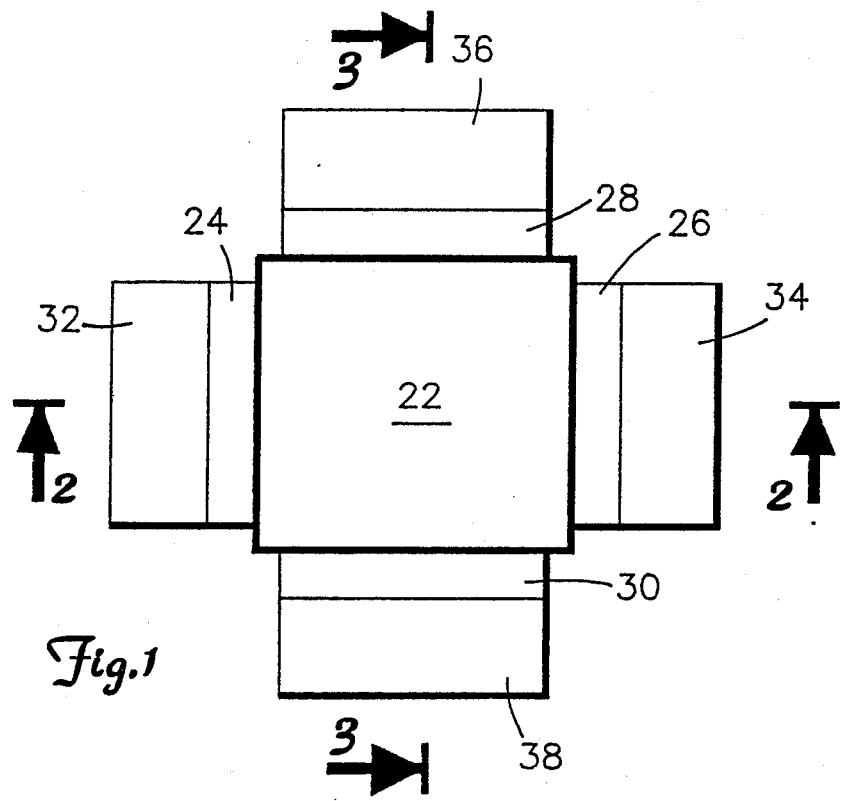
FIG. 1 is a top view of a modulation doped radiation semiconductor device of the present invention.
Figure 2:
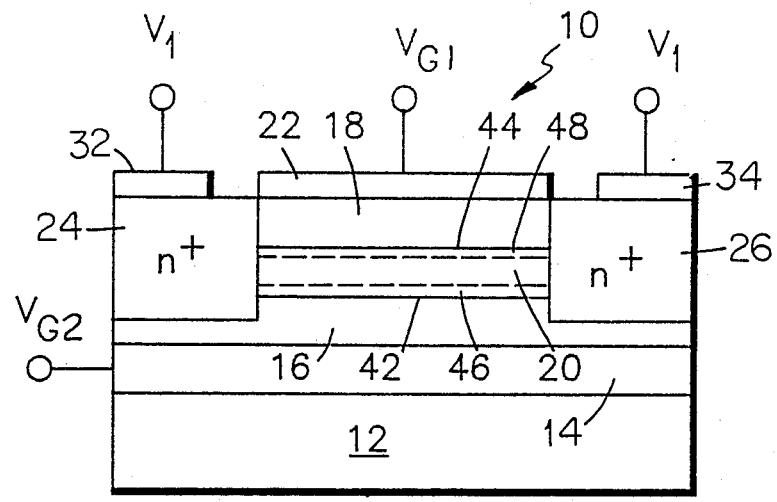
FIG. 2 is a sectional view along section 2—2 of FIG. 1.
Figure 3:
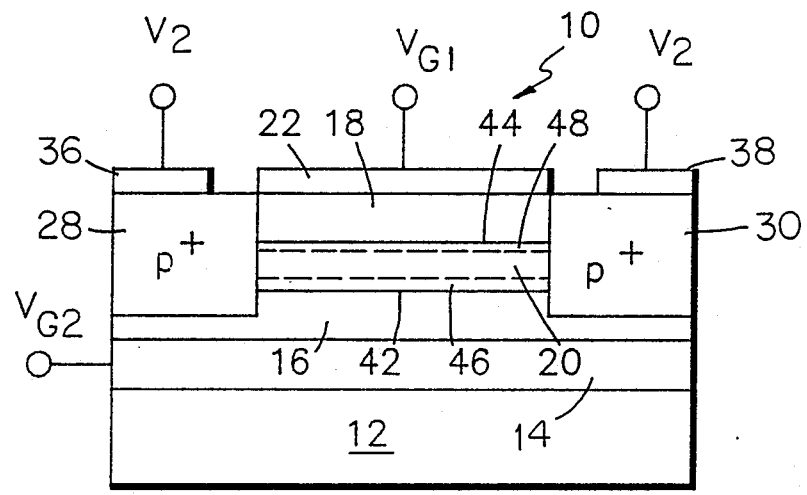
FIG. 3 is a sectional view along section 3—3 of FIG. 1.

As shown in FIGS. 1-3, radiation emitting semiconductor device 10 is formed on an insulating or semi-insulating substrate 12 and includes a bottom gate 14, a bottom wide band gap semiconductor layer 16, a top wide band gap layer 18, and an intermediate narrower band gap active layer 20 which is sandwiched between top and bottom layers 16 and 18. The top gate 22 is positioned over top layer 18.

A pair of N+ regions 24 and 26 are positioned along opposite edges of active layer 20, and are preferably made of a similar or a compatible semiconductor material which is capable of being doped N type. A pair of P+ regions 28 and 30 are positioned along opposite edges of active layer 20.

Electrical contacts 32 and 34 make ohmic contact to N+ type regions 24 and 26, respectively. Similarly, contacts 36 and 38 make ohmic contact to P+ regions 28 and 30, respectively. These contacts may be alloyed in to the N+ and P+ region to provide smaller contact resistance.

Because of the difference in band gap between active layer 20 and bottom and top layers 16 and 18, a heterojunction 42 is formed at the interface of bottom layer 16 and active layer 20, and a heterojunction 44 is formed at the interface of active layer 20 with top layer 18. In a preferred embodiment, gates 14 and 22 form Schottky barriers with layers 16 and 18, respectively, although alternatively gates 14 and 22 are made from doped semiconductor material. Gate voltages $V_{G1}$ and $V_{G2}$ are applied to gates 22 and 14, respectively to induce the electron and hole two-dimensional (2-d) gases in active layer 20. Gate voltage $V_{G1}$ is positive with respect to voltage $V_1$. Gate voltage $V_{G2}$ is negative with respect to voltage $V_2$. As shown in FIGS. 2 and 3, bottom gate 14 induces a 2-d hole gas 46 in layer 20 adjacent heterojunction 42. Top gate 22 induces 2-d electron gas 48 within layer 20 adjacent heterojunction 44.

N+ regions 24 and 26 make electrical contact to 2-d electron gas 48, while P+ regions 28 and 30 make electrical contact to 2-d hole gas 46. Although N+ contacts 24 and 26 extend into bottom layer 16 and therefore are in physical contact with 2-d hole gas 46, they form a PN junction. Similarly, P+ regions 28 and 30 form a PN junction with 2-d electron gas 48. This provides the possibility of separately biasing the N+ contacts 32 and 34 with bias voltage $V_1$ and the P+ contacts 36 and 38 with bias voltage $V_2$. N+ contacts serve as a source of electrons, P+ contacts serve as a source of holes.

A typical thickness of a 2-d electron gas or 2-d hole gas is on the order of 100 Angstroms. Therefore, when the thickness of narrow band active layer 20 is equal to or smaller than approximately 200 Angstroms, a field-induced PN junction is formed by applying the gate voltages and inducing the two-dimensional electron and hole gases 48 and 46, respectively.

Figure 4:
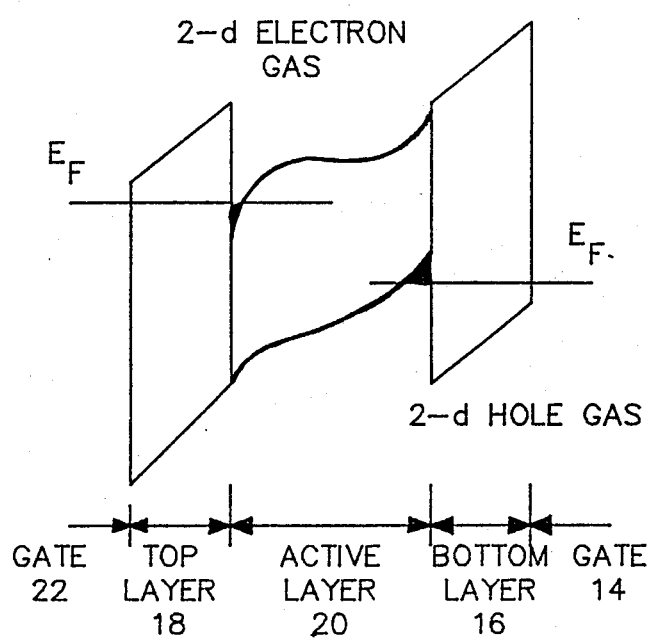
FIG. 4 is a band diagram of the device of FIGS. 1-3.

If the thickness of active layer 20 is greater than about 200 Angstroms, an induced PIN structure is formed by the application of the gate voltages and the inducing of 2-d electron and hole gases 46 and 48. The PIN structure is shown in FIGS. 2 and 3, and in the energy band diagram shown in FIG. 4.

The induced PN junction or PIN structure can be biased just as a conventional junction, so that the electrons and holes recombine producing radiation. When top gate 22 is made of a transparent conducting film such as indium tin oxide, device 10 forms a light emitting diode. By choosing an appropriate dimension of substrate 12 and polishing it (so that an optical resonator is formed), device 10 acts as a semiconductor laser.

A wide variety of different semiconductor materials can be used for the semiconductor layers 16, 18, and 20. The requirements are that layers 16 and 18 have a larger band gap than active layer 20, so that heterojunctions 42 and 44 are formed. The materials of layers 16 and 18 must be sufficiently compatible with the active layer 20 so that lattice mismatch is not excessive. However, these materials need not to be the same.

In one embodiment of the present invention, active layer 20 is gallium arsenide (GaAs), while bottom and top layers 16 and 18 are aluminum gallium arsenide (AlGaAs) having a wider band gap than GaAs.

There are several advantages of the optical device 10 of the present invention. First, the absence of impurities and related traps in active layer 20 leads to an increase in the carrier lifetime and, hence, to a decrease in non-radiative recombination. This, in turn, improves light emitting diode efficiency and leads to a decrease in the threshold current for the stimulated emission.

Second, the present invention is compatible with relatively wide band semiconductors which are difficult to dope with impurities both N-type and P-type. The difficulty in forming PN junctions by impurity doping has impeded the development of semiconductor lasers (and LEDs) in the visible range and even shorter wavelengths.

The present invention overcomes the problems associated with impurity doping because the PN junction or PIN structure is formed by modulation doping (i.e. is field induced) rather than by impurity doping.

Although the present invention has been described with reference to preferred embodiments, workers skilled in the art will recognize that changes may be made in form and detail without departing from the spirit and scope of the invention.

What is claimed is:

1. A radiation emitting semiconductor device for emitting radiation based upon recombination of electrons and holes comprising:
    a layered structure including:
        a first gate electrode for applying a first electric field;
        a second gate electrode for applying a second electric field;
        a narrow band gap semiconductor layer between the first and second gate electrodes within which radiative recombination takes place between electrons from a first field-induced channel and holes from a second field-induced channel;
        a first wide band gap semiconductor layer sandwiched between the first gate electrode and the narrow band gap semiconductor layer, the first wide band gap semiconductor layer having a wider band gap than the narrow band gap semiconductor layer, wherein the first wide band gap semiconductor layer and the narrow band gap semiconductor layer form a first heterojunction for confining electrons, so that upon application of the first electric field by the first gate electrode the first field-induced channel for electrons is formed in the narrow band gap semiconductor layer adjacent to the first heterojunction; and
        a second wide band gap semiconductor layer sandwiched between the narrow band gap semiconductor layer and the second gate electrode, the second wide band gap semiconductor layer having a wider band gap than the narrow band gap semiconductor layer, wherein the second wide band gap semiconductor layer and the narrow band gap semiconductor layer form a second heterojunction for confining holes, so that upon application of the second electric field by the second gate electrode the second field-induced channel for holes is formed in the narrow band gap semiconductor layer adjacent to the second heterojunction;
    an n+ region contacting the layered structure for providing electrical contact to the first field-induced channel in the narrow band gap semiconductor layer;
    a p+ region contacting the layered structure for providing electrical contact to the second field-induced channel in the narrow band gap semiconductor layer;
    a first electrical contact contacting the n+ region; and
    a second electrical contact contacting the p+ region.

2. The semiconductor device of claim 1 including a first gate contact elastically connected to the first gate electrode.

3. The semiconductor device of claim 2 including a second gate contact electrically connected to the second gate electrode.

4. The semiconductor device of claim 1 wherein the first and second gate electrodes comprise metal.

5. The semiconductor device of claim 1 wherein the first and second gate electrodes comprise highly doped semiconductor material.

6. The semiconductor device of claim 1 wherein the n+ region and the p+ region are in direct contact with the first wide band gap semiconductor layer, the second wide band gap semiconductor layer and the narrow band gap semiconductor layer.

7. The semiconductor device of claim 1 wherein the narrow band gap semiconductor layer separates the first wide band gap semiconductor layer from the second wide band gap semiconductor layer by a separation distance of less than about 200 Angstroms.

8. The semiconductor device of claim 1 wherein the narrow band gap semiconductor layer region separates the first wide band gap semiconductor layer from the second wide band gap semiconductor layer by a separation distance of more than about 200 Angstroms.

9. The semiconductor device of claim 1 wherein the first and second gate electrodes from first and second Schottky barriers with the first wide band gap semiconductor region and the second wide band gap semiconductor region, respectively.

10. The semiconductor device of claim 1 wherein the narrow band gap semiconductor layer comprises GaAs.

11. The semiconductor device of claim 10 wherein the first and second wide band gap semiconductor layers comprise AlGaAs.

12. The semiconductor device of claim 1 including a plurality of n+ regions contacting the layered structure.

13. The semiconductor device of claim 1 including a plurality of p+ regions contacting the layered structure.

* * * * *

UNITED STATES PATENT AND TRADEMARK OFFICE
CERTIFICATE OF CORRECTION

PATENT NO. : 4,905,059
DATED : February 27, 1990
INVENTOR(S) : Michael Shur

It is certified that error appears in the above-identified patent and that said Letters Patent is hereby corrected as shown below:

Column 4, line 53, delete "elastically" and insert --electrically--.

Signed and Sealed this

Twelfth Day of February, 1991

Attest:

HARRY F. MANBECK, JR.

*Attesting Officer*  *Commissioner of Patents and Trademarks*